United States Patent
Iwanaga

Patent Number: 5,347,118
Date of Patent: Sep. 13, 1994

[54] ALIGNING METHOD AND APPARATUS DETECTING MISALIGNMENT USING IMAGE SIGNALS FROM IMAGE PICKUP

[75] Inventor: Takehiko Iwanaga, Kawasaki, Japan

[73] Assignee: Canon Kabushiki Kaisha, Tokyo, Japan

[21] Appl. No.: 155,538

[22] Filed: Nov. 22, 1993

Related U.S. Application Data

[63] Continuation of Ser. No. 2,428, Jan. 8, 1993, abandoned.

[30] Foreign Application Priority Data

Jan. 17, 1992 [JP] Japan .................. 4-026011
Jan. 17, 1992 [JP] Japan .................. 4-026085

[51] Int. Cl.$^5$ ............................................. G01J 1/32
[52] U.S. Cl. ........................................ 250/205; 250/548
[58] Field of Search ................ 250/548, 561, 205; 356/399–401

[56] References Cited

U.S. PATENT DOCUMENTS

| | | | |
|---|---|---|---|
| 5,048,967 | 9/1991 | Suzuki et al. | 356/400 |
| 5,053,614 | 10/1991 | Yui et al. | 250/205 |
| 5,141,321 | 8/1992 | Tsuruoka | 250/205 |

*Primary Examiner*—David C. Nelms
*Assistant Examiner*—Stephone B. Allen
*Attorney, Agent, or Firm*—Fitzpatrick, Cella, Harper & Scinto

[57] ABSTRACT

A method of aligning a substrate includes the steps of detecting misalignment of the substrate using an image signal from a charge coupled device (CCD) camera which receives light reflected by an alignment mark on the substrate illuminated by pulse light, and moving the substrate in accordance with the detected misalignment. If the amount of light received by the camera during a predetermined time period does not reach a predetermined value, the predetermined time period is increased. If the amount of light exceeds the predetermined value, the amount of light emitted by the source of the pulse light for each pulse is reduced. An aligning apparatus for carrying out the method includes a light source for generating pulse light for illuminating an alignment mark on a substrate, a camera for receiving light reflected by the alignment mark to generate an image signal, a signal processing circuit for detecting misalignment of the substrate based on the image signal, a driver for moving the substrate in accordance with the output from the signal processing circuit, a detector for monitoring the amount of light received by the camera, and a light modulating mechanism for adjusting the amount of light emitted by the light source in accordance with the output from the light amount detector.

12 Claims, 12 Drawing Sheets

ALIGNING METHOD AND APPARATUS DETECTING MISALIGNMENT USING IMAGE SIGNALS FROM IMAGE PICKUP

This application is a continuation of application Ser. No. 08/002,428 filed Jan. 8, 1993, now abandoned.

BACKGROUND OF THE INVENTION

Field of the Invention

This invention relates to a substrate-aligning method and apparatus for aligning a substrate, such as a wafer or the like, using pulse light as illuminating light in a semiconductor exposure apparatus which prints a pattern provided on a reticle on the substrate in order to manufacture semiconductor devices.

Description of the Related Art

In the field of exposure apparatuses in which an integrated-circuit pattern is printed on a semiconductor wafer, step-and-repeat-type projection exposure apparatuses (hereinafter termed "steppers") have been mainly used in accordance with the recent tendency toward, for example, finer circuit patterns, and an increase in the wafer size. Various methods have been proposed and practiced with respect to alignment between a reticle and a substrate, such as a wafer or the like, in an exposure apparatus represented by the above-described stepper.

In the prior art, for example, light emitted from an illuminating light source for alignment (for example, laser light) is projected from above a reticle, light reflected by a reticle mark and a wafer mark is detected by a photoelectric detection unit, and the center of a mark pattern is obtained from a detection signal, for example, an image signal, from the detection unit, and as a result the relative positional deviation between the reticle and the wafer is detected.

However, in the above-described conventional approach, if illuminating light for alignment comprises pulse light, such as pulse laser light or the like, speckles are generated in the image signal, whereby exact measurement cannot be performed. The details of such a phenomenon will now be described.

In the above-described method, the illuminating light for alignment is generally obtained from the same light source as an exposure light source. A description will now be provided of a case wherein, in an excimer-laser stepper which uses an excimer laser as an exposure light source, illuminating light for alignment is obtained from an excimer-laser illuminating system in TTL(through-the-lens)-type alignment.

Since laser light has high coherency, speckles and interference fringes are generated if the laser light is directly projected onto a wafer or the like. Accordingly, the influence of speckles and interference fringes is removed according to an accumulated effect obtained by changing the phases of speckles and interference fringes for each pulse by oscillating the laser beam or using a rotating diffusing plate, and projecting a plurality of such pulse light beams. In the case of exposing a wafer, several tens to several hundreds of pulse light beams are required in order to remove interference fringes and speckles.

In alignment, however, the detection timing and the receiving time period of the photoelectric detection unit for reflected light cause a problem. For example, when a CCD (charge-coupled device) camera conforming to the NTSC system is used as the photoelectric detection unit, the exposure (storage) time for one picture frame is 1/60 second in the case of field storage, and 1/30 second in the case of frame storage. If the pulse rate of the excimer laser is assumed to be 200 Hz, the number of light pulses projected during the storage time is about 3 pulses in the case of field storage, and 6-7 pulses in the case of frame storage. Such values are insufficient for completely removing interference fringes and speckles. Moreover, the CCD camera has low sensivity for ultraviolet rays, and some resists greatly absorb light reflected by the wafer. Hence, the amount of alignment light reflected by the wafer at the light-receiving side will become insufficient.

FIG. 9 is a time chart of detection when a frame-storage-type CCD camera conforming to the NTSC system is used. In FIG. 9, ST represents a measurement-start signal. Reception of an image for measurement is started from the subsequent VD signal, which is a vertical synchronizing signal. LS represents laser output pulses, which are projected so as to provide a uniform amount of light within each field. IM represents the contents of a memory which stores an image signal output from the CCD camera via a control unit. As can be understood from FIG. 9, in the prior art, the wafer is illuminated by laser output pulses comprising only a few pulses (6 pulses in the present time chart) for obtaining one image. Hence, it is impossible to obtain an image which is free from speckles and interference fringes generated due to high spatial coherency of laser light.

SUMMARY OF THE INVENTION

The present invention has been made in consideration of the above-described problems.

It is an object of the present invention to provide a substrate-aligning method and apparatus in which, in alignment using pulse light as illuminating light, a clear image signal for alignment is obtained without being influenced by speckles, whereby it is possible to detect misalignment of a substrate with high precision, and to perform highly precise alignment.

According to one aspect, the present invention which achieves the above-described objective relates to an aligning method, comprising the steps of: detecting misalignment of a substrate using an image signal from image pickup means for receiving light reflected by an alignment mark on the substrate illuminated by pulse light; moving the substrate in accordance with the detected misalignment; and if the amount of light received by the image pickup means during a predetermined time period does not reach a predetermined value, increasing the predetermined time period, and reducing an amount of light emitted by the light source of the pulse light for each pulse if the amount of light exceeds the predetermined value.

According to another aspect, the present invention which achieves the above-described objective relates to an aligning apparatus, comprising: illuminating means comprising a light source for generating pulse light for illuminating an alignment mark on a substrate; image pickup means for receiving light reflected by the alignment marks to generate an image signal; a signal processing circuit for detecting misalignment of the substrate based on the image signal; driving means for moving the substrate in accordance with an output from the signal processing circuit; a light-amount detector for monitoring the amount of light received by the image pickup means; and a light-modulating mechanism for adjusting the amount of light emitted by the light source in accordance with an output from the light-amount detector.

According to the present invention, the generation of speckles is prevented by setting the exposure time of the image pickup means to a value equal to at least the time period necessary for receiving light reflected by the alignment mark having the number of pulses sufficient enough to prevent the generation of speckles in the image signal representing the reflected light. If the amount of light received by the image pickup means is insufficient for obtaining a clear image signal, a necessary amount of light can be secured by extending the exposure time. If the amount of light received by the image pickup means is too large, a clear image signal can be obtained by reducing the amount of light emission of the light source of the pulse light.

By providing the light-amount detector for monitoring the amount of the reflected light, and the light-modulating mechanism for controlling the amount of light emission of the light source of the pulse light in accordance with an output from the light-amount detector, the exposure time of the image pickup means and the amount of light emission of the light source can be easily adjusted.

FIG. 10 is a time chart when the CCD camera is operated in a long-time-exposure mode with an exposure time of at least 1/30 second. ST represents a signal for controlling the starting and stopping of measurement. According to such a time chart, it is possible to obtain an image free from speckles and interference fringes which is provided by laser light comprising several tens of light pulses.

As can be seen in FIG. 10, 24 laser output pulses are generated during the time periods denoted by "first measurement frame" and "second measurement frame". This is a sufficient number of pulses to generate an image free from speckles and interference fringes. Image signals representing images generated during each measurement frame are stored in the memory IM as seen in FIG. 10.

However, the S/N ratio of the obtained image is in some cases inferior, since background noise increases due to the influence of dark current in the CCD.

It is another object of the present invention to provide a substrate-aligning method in which, in alignment using pulse light as illuminating light, highly precise alignment of a substrate can be performed by obtaining an image of an alignment mark free from speckles and unevenness in illuminance.

According to still another aspect, the present invention which achieves the above-described objective relates to a substrate-aligning method, comprising the steps of: detecting misalignment of a substrate illuminated by pulse light using an image signal from image pickup means for receiving light reflected by an alignment mark on the substrate; moving the substrate in accordance with the detected misalignment; and enabling the detection of the misalignment in the detecting step by intermittently generating image signals by opening an electronic shutter in synchronization with the emission of the pulse light by the image pickup means, and storing and adding a predetermined number of the image signals generated by the image pickup means in memory means.

An image signal representing an addition reference mark which does not move relative to the image pickup means may be added to each of the image signals in order to correct an error during the addition.

According to the present invention, the image pickup means receives light reflected by the alignment mark only when the pulse light is projected to generate an image signal, whereby a predetermined number of image signals are stored in the memory means without being influenced by noise, such as dark current or the like, and an image of an alignment mark free from speckles and unevenness in illuminance is obtained.

Accordingly, misalignment of the substrate can be highly precisely detected.

According to still another aspect, the present invention which achieves at least one of these objectives relates to a positional error detecting method comprising the steps of detecting positional error of a substrate using an image signal from image pickup means for receiving light reflected by an alignment mark on the substrate illuminated by pulse light, and, if the amount of light received by the image pickup means during a predetermined time period does not reach a predetermined value, increasing the predetermined time period, and reducing the amount of light emitted by the light source of the pulse light for each pulse if the amount of light exceeds the predetermined value.

According to still another aspect, the present invention which achieves at least one of these objectives relates to a positional error detection apparatus comprising illuminating means comprising a light source for generating pulse light for illuminating an alignment mark on a substrate, image pickup means for receiving light reflected by the alignment mark to generate an image signal, a signal processing circuit for detecting positional error of the substrate based on the image signal, a light-amount detector for monitoring the amount of light received by the image pickup means, and a light-modulating mechanism for adjusting the amount of light emitted by the light source in accordance with an output from the light-amount detector.

According to still another aspect, the present invention which achieves at least one of these objectives relates to a positional error detection method, comprising the steps of detecting positional error of a substrate illuminated by pulse light using an image signal from image pickup means for receiving light reflected by an alignment mark provided on the substrate, and enabling the detection of the positional error in the detecting step by intermittently generating image signals by opening an electronic shutter in synchronism with the emission of the pulse light by the image pickup means and storing and adding a predetermined number of image signals generated by the image pickup means in memory means.

The method can further comprise the steps of adding an image signal representing an addition reference mark which does not move relative to the image pickup means to each of the image signals and correcting an error produced during the adding step of adding the predetermined number of image signals by the image signal representing the addition reference mark.

These and other objects, advantages and features of the present invention will become more apparent from the following description of the preferred embodiments taken in conjunction with the accompanying drawings.

DESCRIPTION OF THE PREFERRED EMBODIMENTS

Preferred embodiments of the present invention will now be described with reference to the drawings.

Figure 1:
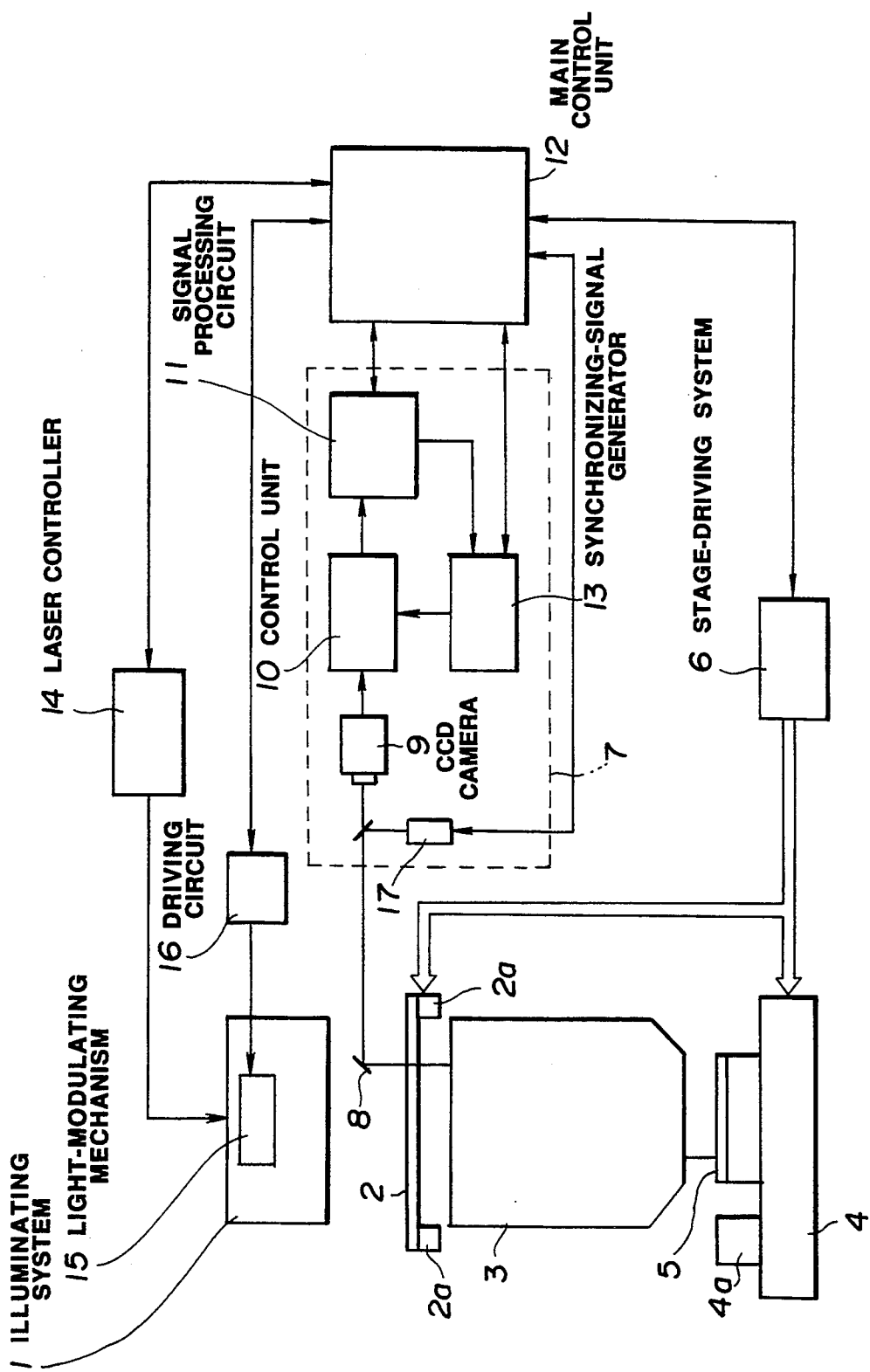
FIG. 1 is a block diagram illustrating an exposure apparatus according to a first embodiment of the present invention.

FIG. 1 is a block diagram of an exposure apparatus for manufacturing semiconductor devices according to an embodiment of the present invention. In FIG. 1, illuminating light emitted from illuminating system 1, serving as illuminating means, which uses a pulse laser, such as an excimer laser or the like, as a light source, exposes wafer 5, serving as a substrate, held on wafer stage 4, via reticle 2 and projection lens system 3. A pattern on reticle 2 is printed on a predetermined shot region of wafer 5. Illuminating system 1 has the function of suppressing speckles by changing the wavefront of the illuminating light with time. Wafer stage 4 is reciprocated in the directions of two orthogonal axes (the x axis and the y axis) within a plane perpendicular to the plane of FIG. 1, and is rotated around an axis (the z axis) which vertically crosses the above-described plane by stage driving system 8, serving as driving means. Reticle stage 2a for holding reticle 2 is also reciprocatable in the x-axis and y-axis directions by stage driving system 6, and is rotatable around the z axis. That is, stage driving system 6 adjusts the relative position between reticle stage 2a and wafer stage 4 by a main control unit (to be described later).

Alignment detection system 7 for detecting the positional relationship between respective alignment marks provided on reticle 2 and wafer 5 uses part of the illuminating light from illuminating system 1 as illuminating light for alignment. Alignment detection system 7 comprises a CCD (charge coupled device) camera 9, a control unit 10, signal processing circuit 11, synchronizing-signal generator 13, and light-amount detector 17. CCD camera 9 detects the images of the respective alignment marks on reticle 2 and wafer 5 using light reflected by mirror 8. Although in an actual reduction projection exposure apparatus the same detection system as the above-described alignment detection system 7 is provided at a position symmetric relative to the optical axis of projection optical system 3, such a system is omitted in FIG. 1.

Image signals from CCD camera 9 provided within alignment detection system 7 are input to signal processing circuit 11 via control unit 10. Signal processing circuit 11 detects a state of deviation between superposed images of the respective alignment marks of wafer 5 and reticle 2 on the light-receiving surface of CCD camera 9 based on the image signals, and outputs a signal representing the amount of deviation between wafer 5 and reticle 2 to main control unit 12. Stage driving system 6 is controlled by an output signal from main control unit 12, and alignment between reticle 2 and wafer 5 is performed by moving reticle stage 2a and wafer stage 4 with respect to each other. Synchronizing-signal generator 13 generates a synchronizing signal for the detection system and a synchronizing signal for the laser, and supplies these signals to control unit 10 and main control unit 12 which in turn supplies these signals to signal processing circuit 11, laser controller 14, and stage driving system 6. Synchronizing-signal generator 13 may be included within signal processing circuit 11 or main control unit 12.

Illuminating system 1 includes light-modulating mechanism 15 for alignment, and driving circuit 16 drives light-modulating mechanism 15 in accordance with a control signal from main control unit 12.

Light-amount detector 17 detects the amount of light incident upon CCD camera 9. Main control unit 12 controls laser controller 14 or light-modulating mechanism 15 so that the amount of light incident upon the detection system has an appropriate value using a signal from light-amount detector 17. Although in the present embodiment light-amount detector 17 is within alignment detection system 7, it may be provided within illuminating system 1.

Figure 2:
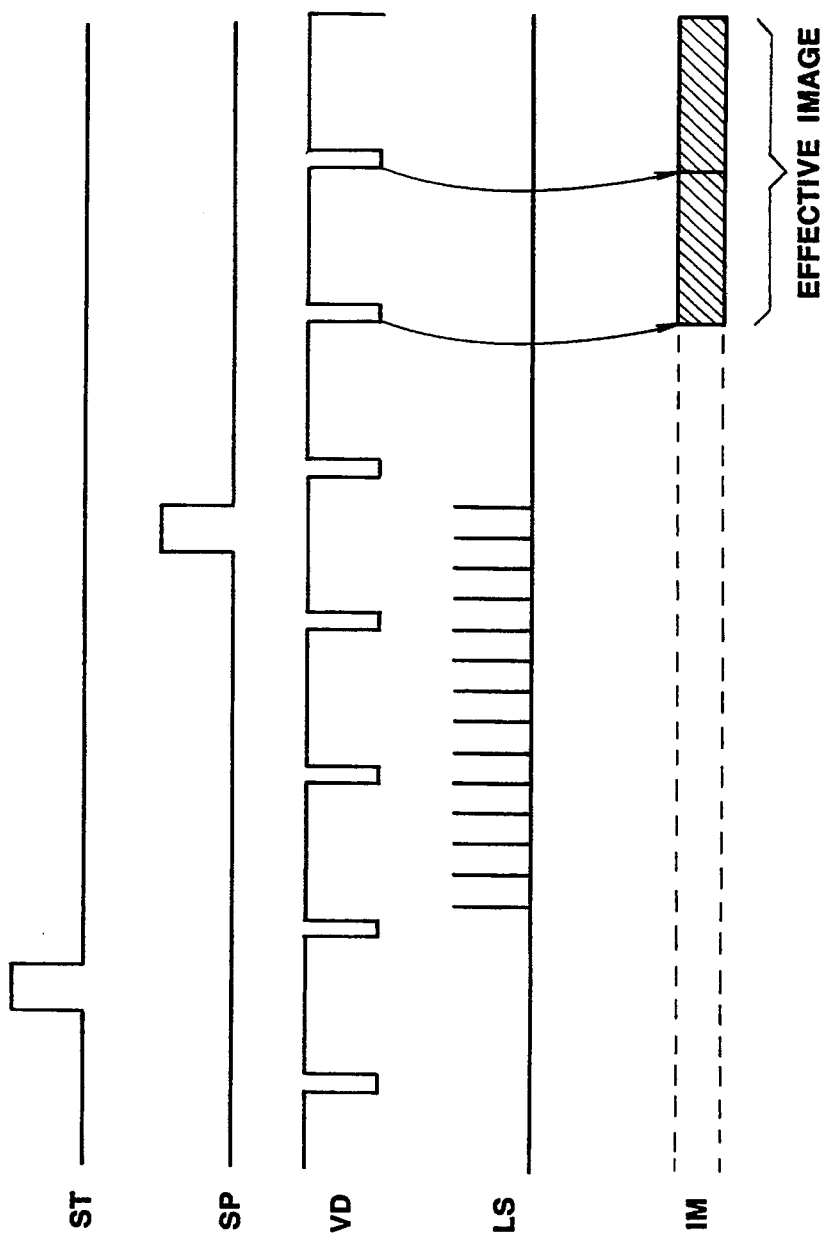
FIG. 2 is a time chart in the first embodiment.

FIG. 2 is a time chart of the present embodiment, in which CCD camera 9 is operated in a long-time-exposure mode it with an exposure time of at least 1/30 second. The output of laser pulses and the storage of an image represented by an image signal are started from the VD signal succeeding measurement start signal ST, and are terminated by laser-output stop signal SP when the number of light pulses corresponds to an appropriate amount of light. The obtained image is stored in image memory IM for measurement at the next VD signal. Thus, it is possible to obtain an image free from speckles and interference fringes illuminated by laser light comprising several tens to several hundreds of light pulses.

Figure 3:
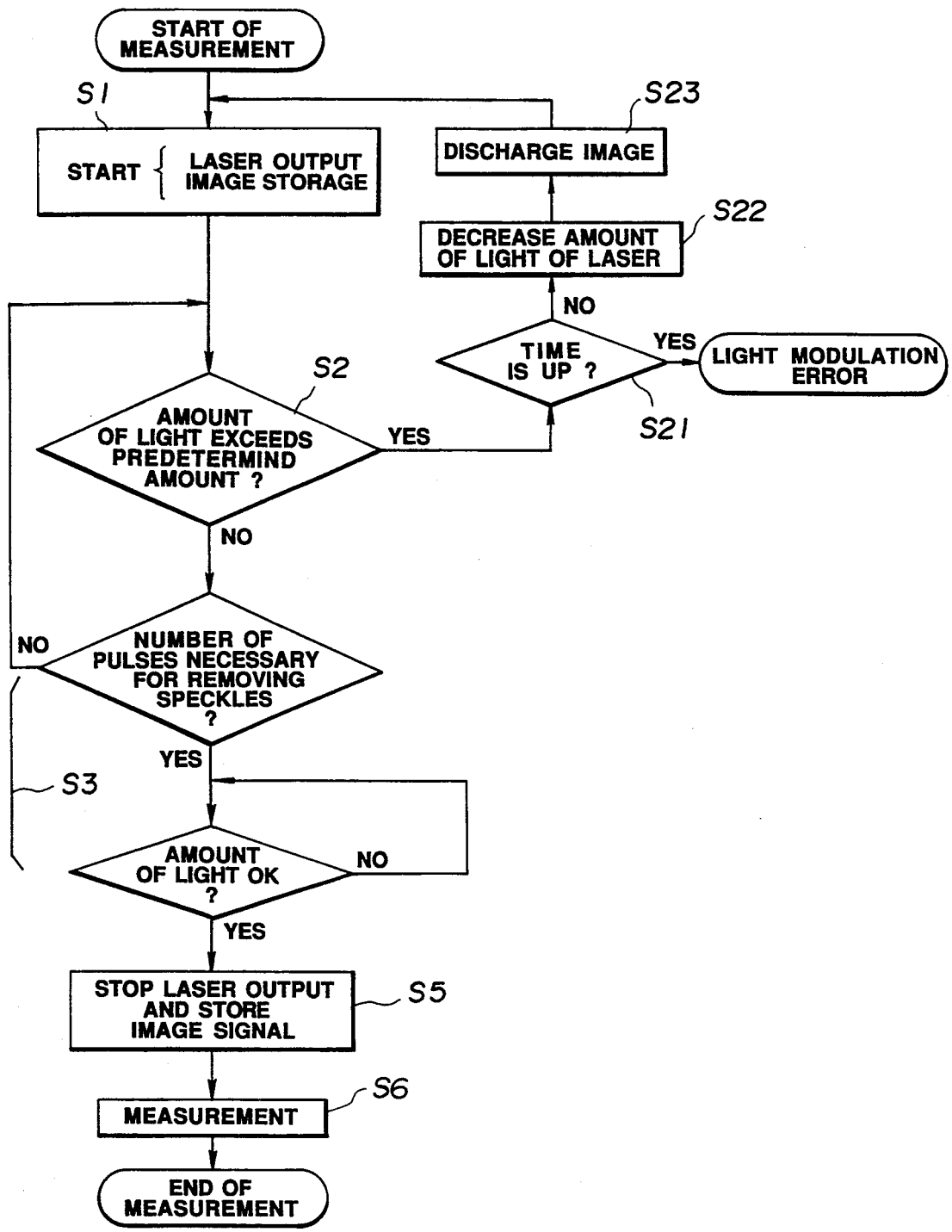
FIG. 3 a flowchart illustrating a measurement sequence for setting the exposure time and the amount of light.

Next, the control of the number of pulses will be described. FIG. 3 shows a flowchart of the first measurement operation of the first shot region. In general, in the wafer exposure system, the number of light pulses necessary for removing speckles is provided as a parameter. Also in the measuring system, the number of light pulses necessary for removing speckles is provided as a parameter.

The number of light pulses in the measuring system may be the same as in the wafer exposure system, or may be calculated based on the number of light pulses in the wafer exposure system. Alternatively, the number of light pulses necessary for removing speckles previously obtained in the apparatus may be input.

In step S1, the output of laser pulses from illuminating system 1, and the storage of an image in CCD camera 9 are started by a measurement start signal. At the same time, monitoring of the amount of light by light-amount detector 17 is started. If the amount of light detected by light-amount detector 17 exceeds a predetermined amount of light before the number of laser pulses reaches the number of light pulses necessary for removing speckles (step S2), after confirming that the predetermined time has not elapsed in step S21, the power of the laser light is adjusted so that the amount of light has a value suitable for the measurement at at least the number of light pulses necessary for removing speckles by light-modulating mechanism 15 in step S22. After discharging the image stored in CCD camera 9 in step S23, the processing from step S1 is repeated. If the amount of light exceeds the predetermined amount but the number of pulses necessary to remove speckles has not been reached in step S3, the method returns to step S2 and the laser continues outputting pulses until the number of pulses necessary to remove speckles has been reached. In addition, if the predetermined time has elapsed and the amount of light exceeds the predetermined amount as indicated in step S21, the main control unit 12 determines that a light modulation error has occurred. If the amount of laser light does not reach the predetermined amount of light even when the number of laser pulses has reached the number of light pulses necessary for removing speckles, exposure is continued until the amount of laser light reaches the predetermined amount of light (step S3). When the amount of laser light has reached the predetermined amount of light, the output of the laser pulses is stopped, and an image signal obtained from CCD camera 9 is stored in a memory within signal processing circuit 11 (step S5), and measurement is performed in step S6. After a second measurement operation of a second shot region, modulation of light and measurement are performed with the number of laser pulses and the laser power obtained in the first measurement operation of the first shot region in order to realize a high throughput.

Although in the above-described embodiment the amount of illuminating light for alignment is monitored using light-amount detector 17 in order to obtain an amount of light suitable for measurement at the number of light pulses necessary for removing speckles, monitoring of the amount of light by light-amount detector 17 is not always necessary.

Figure 4:
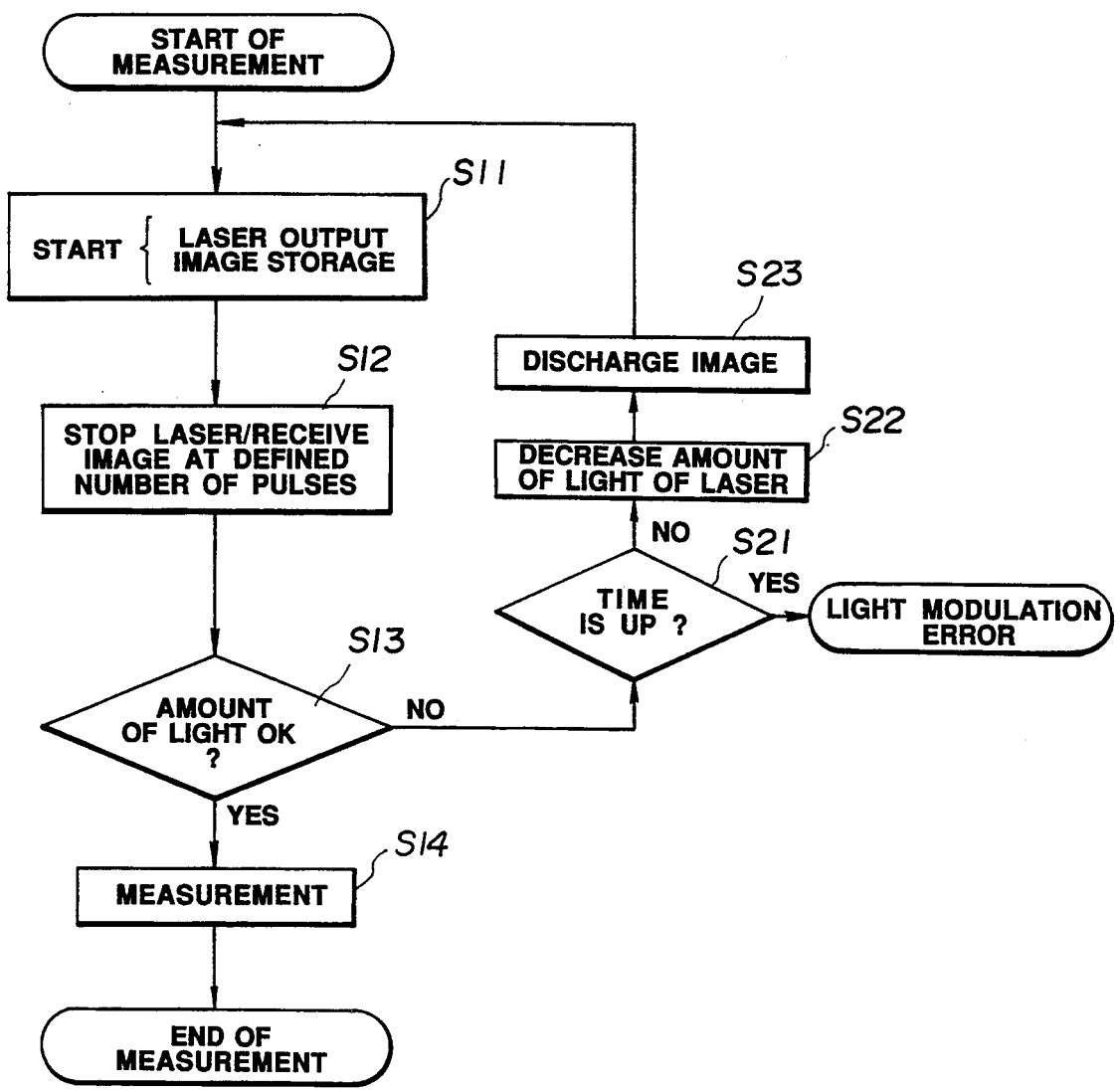
FIG. 4 is a flowchart illustrating another measurement sequence.

FIG. 4 shows a flowchart when light amount detector 17 is not provided. The processing shown in FIG. 4 is the same as the processing shown in FIG. 3 until step S11. Since the amount of light received by CCD camera 9 cannot be monitored during the laser output, in step S12, the output of laser pulses is stopped when the number of laser pulses has reached a defined number of light pulses, and an image is received. The defined number of light pulses must always equal at least the number of light pulses necessary for removing speckles, and is provided as a parameter. If there is no problem with the amount of light of the obtained image in step S13, measurement is performed in step S14 using the image. If the amount of light of the obtained image is insufficient for measurement in step S13, the processing from step S11 is resumed by increasing the number of light pulses. The number of light pulses to be added is determined by calculating the amount of the deficiency in the light level from the amount of light of the initially obtained image. If the amount of light is too large as determined in step S13 (for example, if the obtained image is saturated), the amount of light incident upon CCD camera 9 is reduced adjusting the laser power by light-modulating mechanism and the processing from step S11 is resumed, as indicated in steps S21 through S23 as in the FIG. 3 embodiment. As in the FIG. 3 embodiment, if the predetermined time has elapsed and the amount of light is too large, the main control unit determines that a light modulation error has occurred. After a second measurement operation, modulation of light and measurement are performed with the number of laser pulses and the laser power obtained in the first measurement operation in order to realize a high throughput.

If bleaching of the resist by measurement light during the measurement of the wafer causes a problem, the laser pulses are projected until the influence of bleaching disappears in the measurement, and thereafter. The above-described measurement is performed.

The above-described first measurement operation is not necessarily the first measurement operation for alignment. For example, an alignment mark for an operation other than a measurement operation for global alignment may be used in the first measurement operation. In such a case, the above-described second measurement operation becomes the first measurement operation for actual alignment.

A description has now been provided of the measurement of an alignment mark on the wafer. The same processing may be performed also when measurement of an alignment mark on stage reference mark 4a is performed. Furthermore, by utilizing the fact that the same stable image can be obtained from a stage reference mark, it is possible to check the presence of speckles from the distribution of unevenness in illuminance or the power spectrum of the obtained image in the spatial-frequency region, and to check the number of light pulses necessary for removing speckles by repeating the above-described check while changing the number of light pulses.

Although in the above-described embodiment light-amount detector 17 is provided within alignment detection system 7, it may be provided within the exposure system as described above. In such a case, the ratio of the amount of light of the light-amount detector within the exposure system to the amount of light reaching CCD camera 9 is measured in advance, and the amount of light is determined in consideration of this ratio.

Although in the present embodiment a CCD camera conforming to the NTSC system is used as an image pickup device, a camera conforming to any other system, such as the PAL system or the like, may also be used. Alternatively, a camera, other than cameras conforming to the above-described systems, which operates with its own timing may also be used. Furthermore, a scanning-type position detecting device, such as a one-dimensional line sensor or the like, may also be used.

Figure 5:
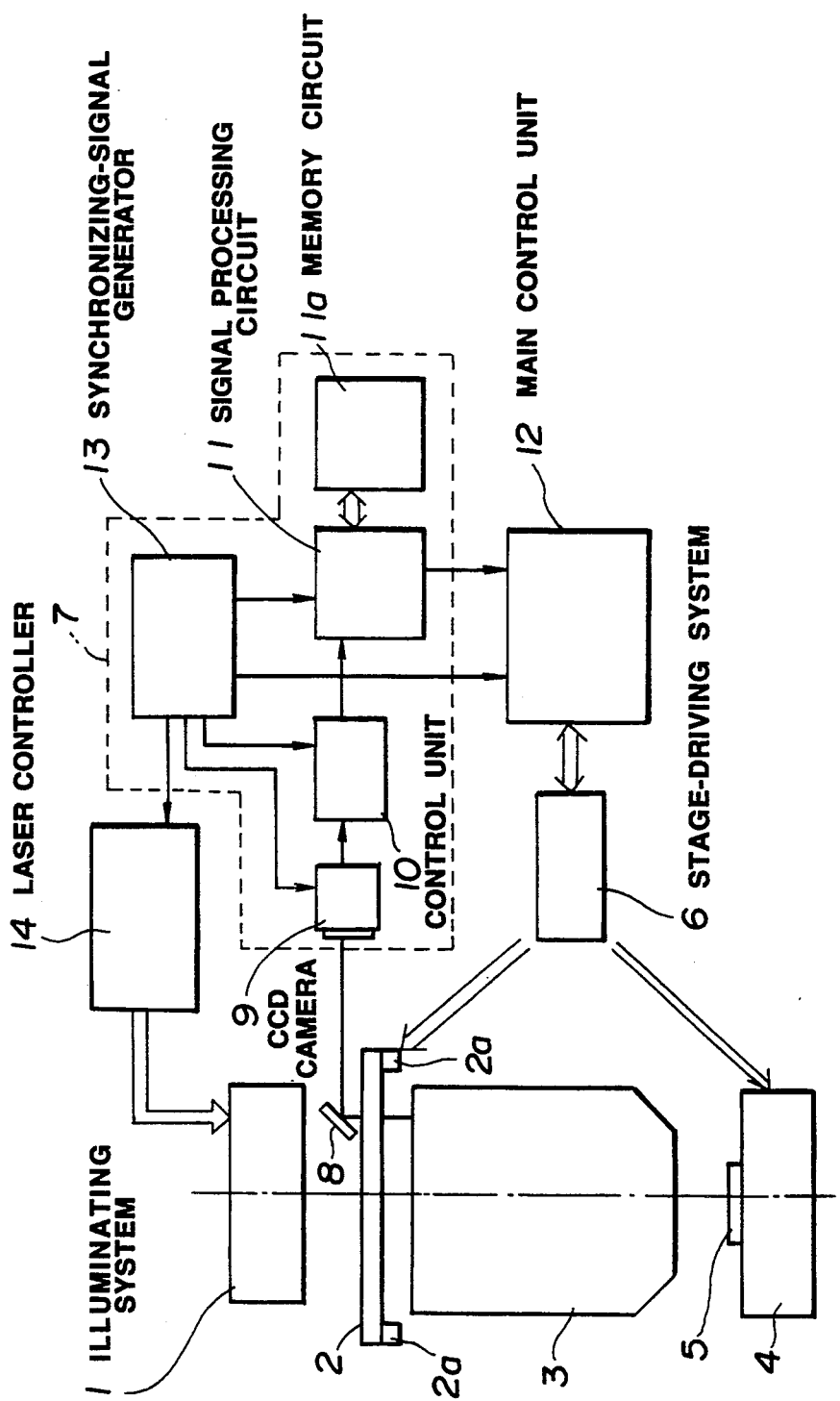
FIG. 5 is a block diagram illustrating an exposure apparatus according to a second embodiment of the present invention.

FIG. 5 is a block diagram of an exposure apparatus according to a second embodiment of the present invention. In FIG. 5, illuminating light emitted from illuminating system 1, serving as illuminating means, which uses a pulse laser, such as an excimer laser or the like, as a light source, exposes wafer 5, serving as a substrate, held on wafer stage 4 via reticle 2 and projection lens system 3. A pattern provided on reticle 2 is thereby printed on a predetermined shot region of wafer 5.

Wafer stage 4 is reciprocated in the directions of two orthogonal axes (the x axis and the y axis) within a plane perpendicular to the plane of FIG. 1, and is rotated around an axis (the z axis) which vertically crosses the above-described plane by stage driving system 6, serving as driving means.

Reticle stage 2a for holding reticle 2 is also reciprocatable in the x-axis and y-axis directions, and is rotatable around the z axis by stage driving system 6.

That is, stage driving system 6 adjusts the relative position between reticle stage 2a and wafer stage 4 by a main control unit 12 (to be described later).

Alignment detection system 7 for detecting the positional relationship between respective alignment marks provided on reticle 2 and wafer 5 uses part of the illuminating light from illuminating system 1 having the function of suppressing speckles by changing the wavefront of the illuminating light with time as illuminating light for alignment. Alignment detection system 7 comprises CCD (charge coupled device) camera 9, control unit 10, signal processing circuit 11, memory circuit 11a, and synchronizing-signal generator 13. CCD camera 9, serving as image pickup means, detects the images of the respective alignment marks on reticle 2 and wafer 5 using light reflected by mirror 8.

Although in an actual reduction projection exposure apparatus the same detection system as the above-described alignment detection system 7 is provided at a position symmetric relative to the optical axis of projection optical system 3, such a system is-omitted in FIG. 5.

Image signals from CCD camera 9 provided within alignment detection system 7 are input to signal processing circuit 11 via control unit 10. An electronic shutter of CCD camera 9 is opened during a short time period including the emission of pulse laser light from illuminating system 1 to generate an image signal.

Signal processing circuit 11 stores the obtained image signal in memory circuit 11a, serving as memory means, which obtains an image of the alignment mark by adding a plurality of image signals.

Signal processing circuit 11 detects a state of deviation between superposed images of the respective alignment marks of wafer 5 and reticle 2 on the light-receiving surface of CCD camera 9 based on the above-described image, and outputs a signal representing the amount of deviation between wafer 5 and reticle 2 to main control unit 12.

Synchronizing-signal generator 13 generates a synchronizing signal for the detection system and a synchronizing signal for the laser, and supplies these signals to control unit 10, signal processing circuit 11, main control unit 12, and laser controller 14 and supplies these signals to stage driving system 6 through main control unit 12. Synchronizing-signal generator 13 may be included within signal processing circuit 11 or main control unit 12.

The time period of the emission of the pulse laser light within illuminating system 1 is several tens of nanoseconds, and therefore the image obtained in other time periods becomes background noise, such as dark current, stray light or the like. Accordingly, by removing electric charges accumulated during time periods other than the laser light irradiation by synchronizing the electronic shutter of the CCD camera with the pulse laser light, and adding image signals obtained only during the laser irradiation in the memory, it is possible to obtain an image free from speckles, unevenness in illuminance and background noise with an excellent S/N ratio.

Figure 6:
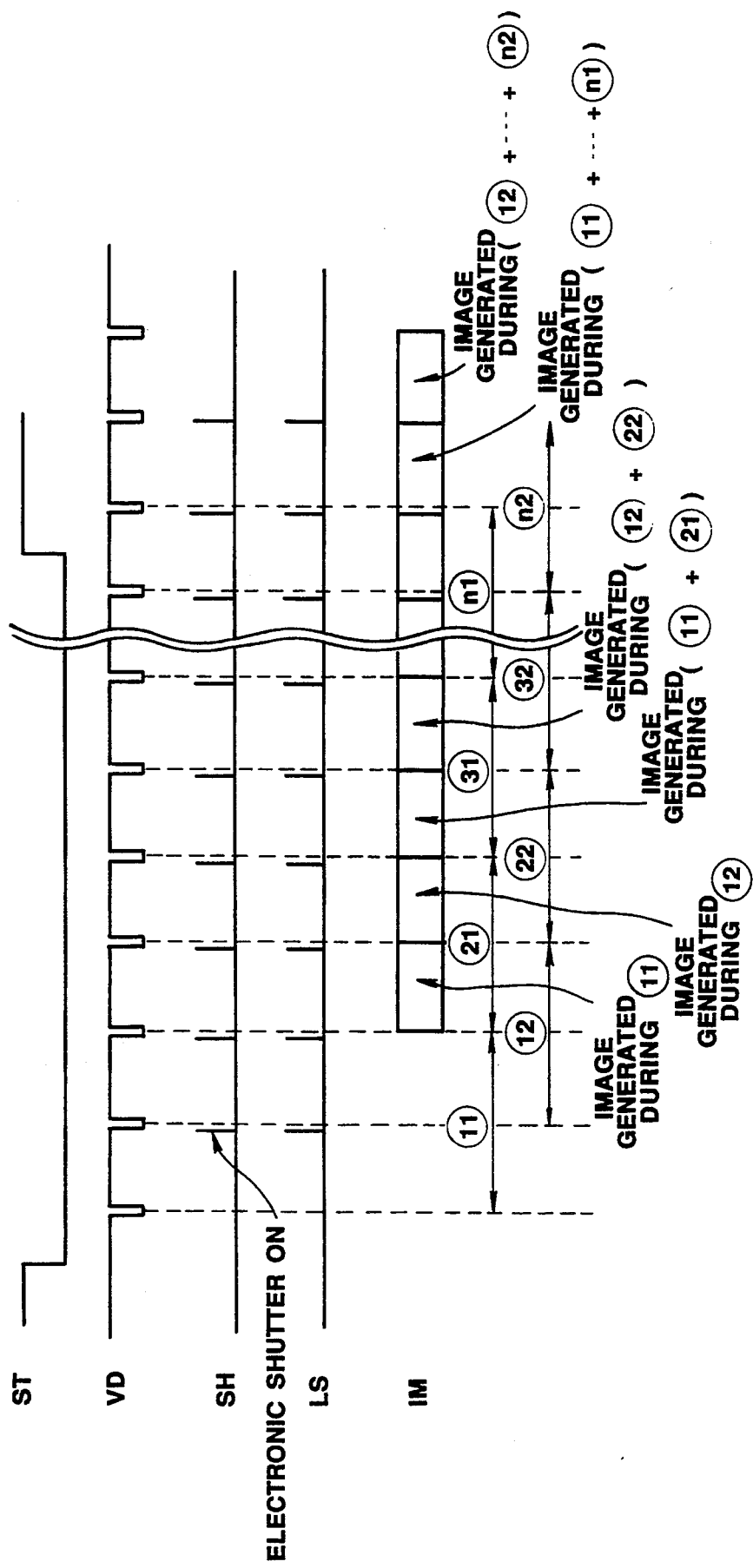
FIG. 6 is a time chart of the second embodiment.

FIG. 6 is a time chart of the second embodiment.

In FIG. 6, SH represents the timing of turning on the electronic shutter, and LS represents laser output pulses. The laser light is output while the electronic shutter is turned on. IM represents the contents of the memory which stores image signals output from CCD camera 9 via control unit 10. The image signals are stored in memory circuit 11a while adding each signal to the signals stored in the memory. At that time, the normalization of data within the memory is performed so that the stored data do not overflow.

FIG. 6 shows time periods (11), (21), (31), and (n1) and time periods (12), (22), (32), and (n2) during which image signals are generated. Time period (11) overlaps time period (12), while time period (12) overlaps time periods (11) and (21). The other time periods overlap each other as shown in FIG. 6. The rectangular boxes in the image memory shown in FIG. 6 represent storage areas of the memory circuit 11a. In the leftmost box, the image signal generated during time period (11) is stored. In the next box to the right, the image signal generated during time period (12) is stored. In the next box to the right, is stored the sum of the image signal generated during time period (11) and the image signal generated during the time period (21). In the next box to the right is stored the sum of the image signal generated during the time period (12) and the signal generated during the time period (22). In the next box to the right (not shown) is stored the sum of the image signal generated during time period (31), the image signal generated during time period (11) and the image signal generated during time period (21). Similarly, in the next box to the right (also not shown) is stored the sum of the image signal generated during time period (32), the image signal generated during the time period (22) and the image signal generated during time period (12). More generally, storage areas storing the sum of the image signal generated during a time period (11) and the image signals generated during a time (n1), where n is an integer greater than 1, alternate with storage areas storing the sum of image signals generated during time periods (12) and (n2), where n is an integer greater than 1.

After receiving a necessary number of light pulses, measurement of the image is performed, and alignment between reticle 2 and wafer 5 is performed by moving one or both of wafer stage 4 and reticle stage 2a in accordance with the result of the measurement.

The present invention may also be executed using a plurality of image memories.

In such a case, the images of respective fields are sequentially stored in memories 1, 2, .... After storing a necessary number of light pulses, images in the respective memories are added, and measurement is performed for an image obtained by the addition. Alignment between reticle 2 and wafer 5 is performed based on the result of the measurement.

Thus, it is possible to obtain an image free from speckles and interference fringes caused by laser light, and to obtain excellent measurement accuracy without being influenced by background noise, such as dark current noise or the like.

Although in the present embodiment a CCD camera conforming to the NTSC system is used as an image pickup device, a camera conforming to any other system, such as the PAL system or the like, may also be used. Alternatively, a camera, other than cameras conforming to the above-described systems, which operates with its own timing may also be used. Furthermore, a scanning-type position detecting device, such as a one-dimensional line sensor or the like, may also be used.

Next, a description will be provided of a third embodiment of the present invention.

When performing image processing using a CCD camera, the CCD camera side of the apparatus is synchronized with a synchronizing signal generated in a processing unit, or the signal processing timing of an image processing unit is synchronized with a synchronizing signal of the CCD camera side of the apparatus. In such a case, however, draw-in means, such as a phase locked loop (PLL) or the like, is used for performing synchronization. Each image signal produces a deviation of a few fractions of a pixel (picture element) due to jitter caused by the draw-in means. Accordingly, in such a configuration, it is impossible to obtain a highly precise image only by simply adding image signals in the above-described manner due to the influence of jitter.

In order to overcome the above-described problem, an addition reference mark is provided within the field of view of an image signal. Measurement of an image is performed not on the basis of pixels, but with respect to the addition reference mark, and addition of image signals is performed in consideration of the deviation caused by jitter of each image signal for the measure value.

Figure 7:
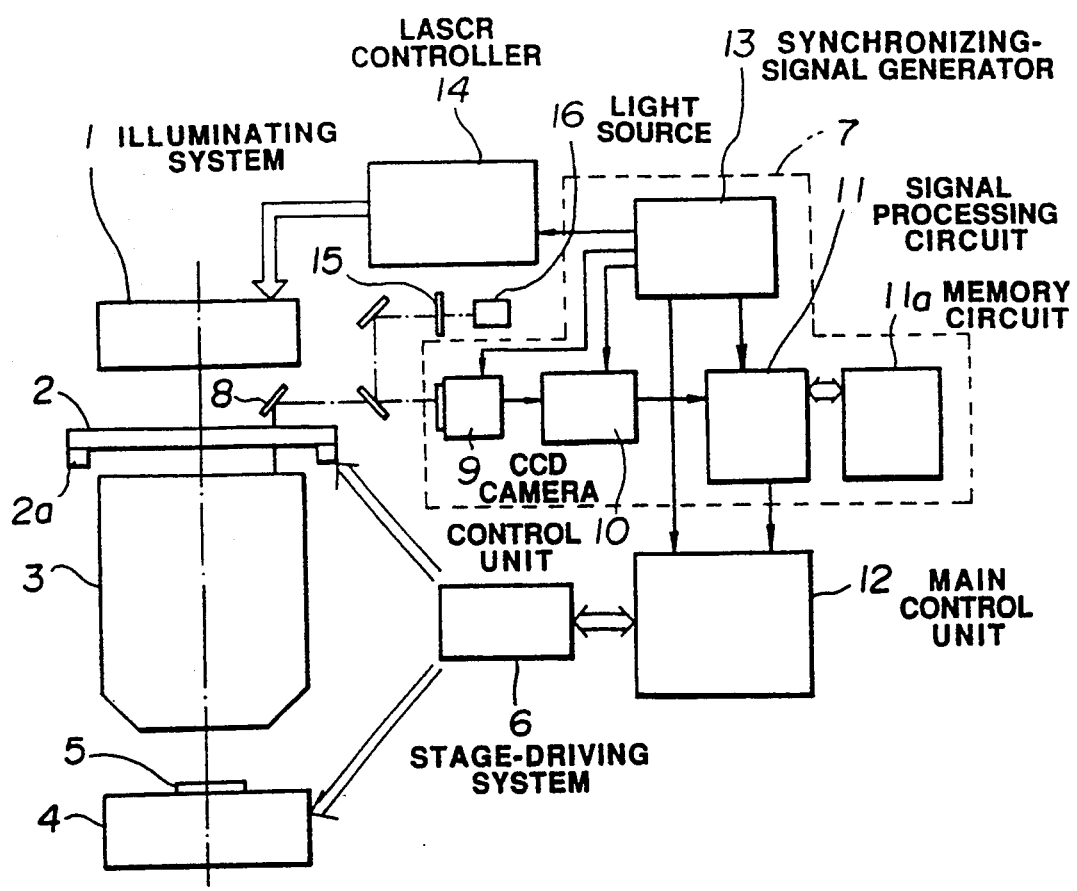
FIG. 7 is a block diagram illustrating an exposure apparatus according to a third embodiment of the present invention.

FIG. 7 is a block diagram illustrating an exposure apparatus of the third embodiment. In FIG. 7, addition reference mark 15 is illuminated by illuminating light from light source 16, and light reflected by addition reference mark 15 is projected onto CCD camera 9. Light source 16 comprises a stable CW (continuous wave) light source, such as a DC-driven LED (light-emitting diode) or the like. It is desirable that a measuring unit has memories for respective received images. Since the apparatus of the third embodiment has the same configuration as the apparatus of the second embodiment except that addition reference mark 15 and light source 16 are provided, the same components as those shown in FIG. 5 are indicated by the same reference numerals, and an explanation thereof will be omitted.

Figure 8:
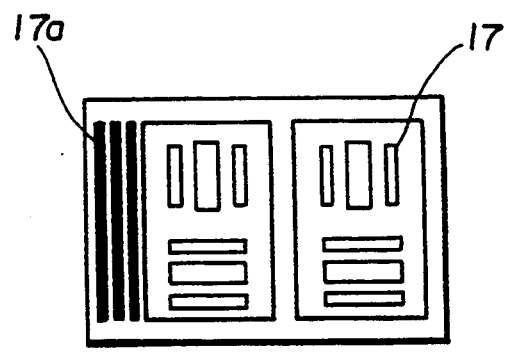
FIG. 8 is a diagram illustrating an image of an alignment mark in the third embodiment.
Figure 9:
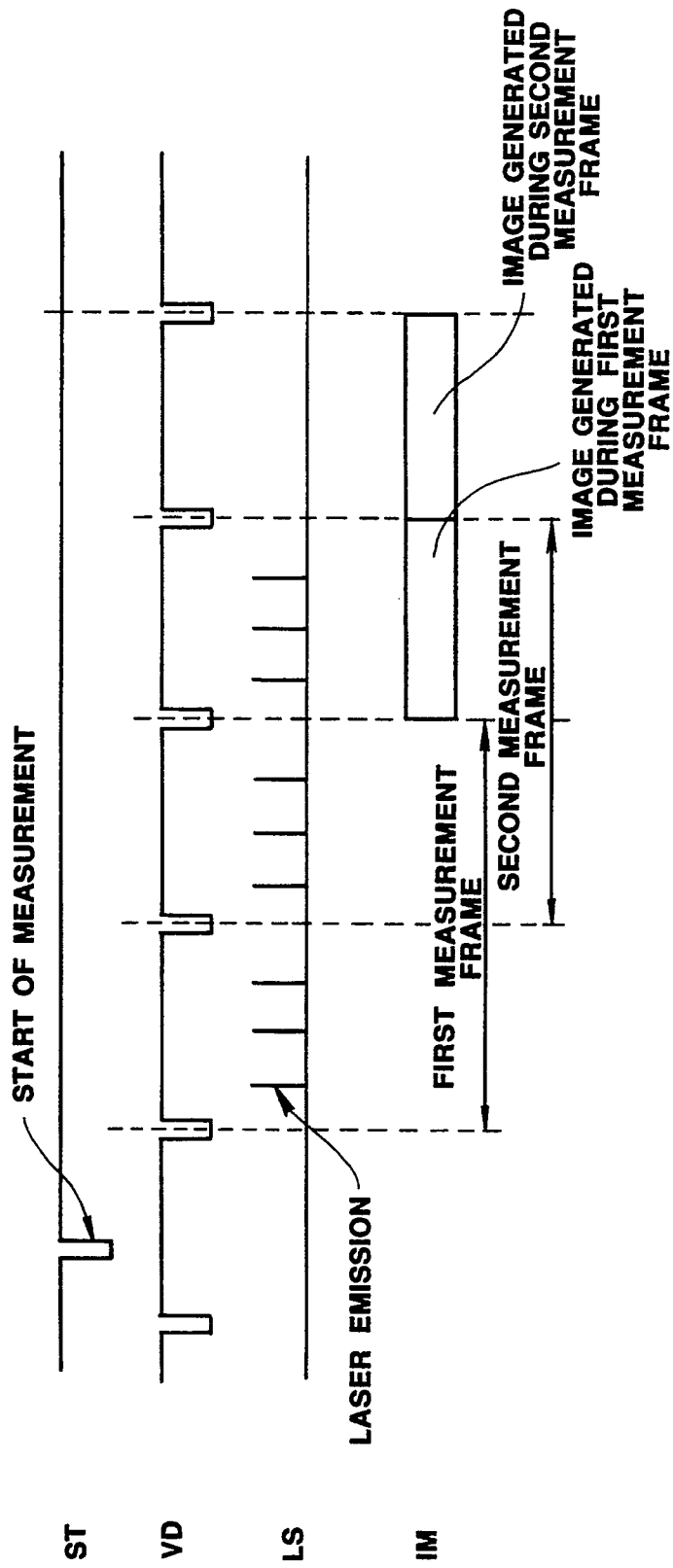
FIG. 9 is an example of a time chart.
Figure 10:
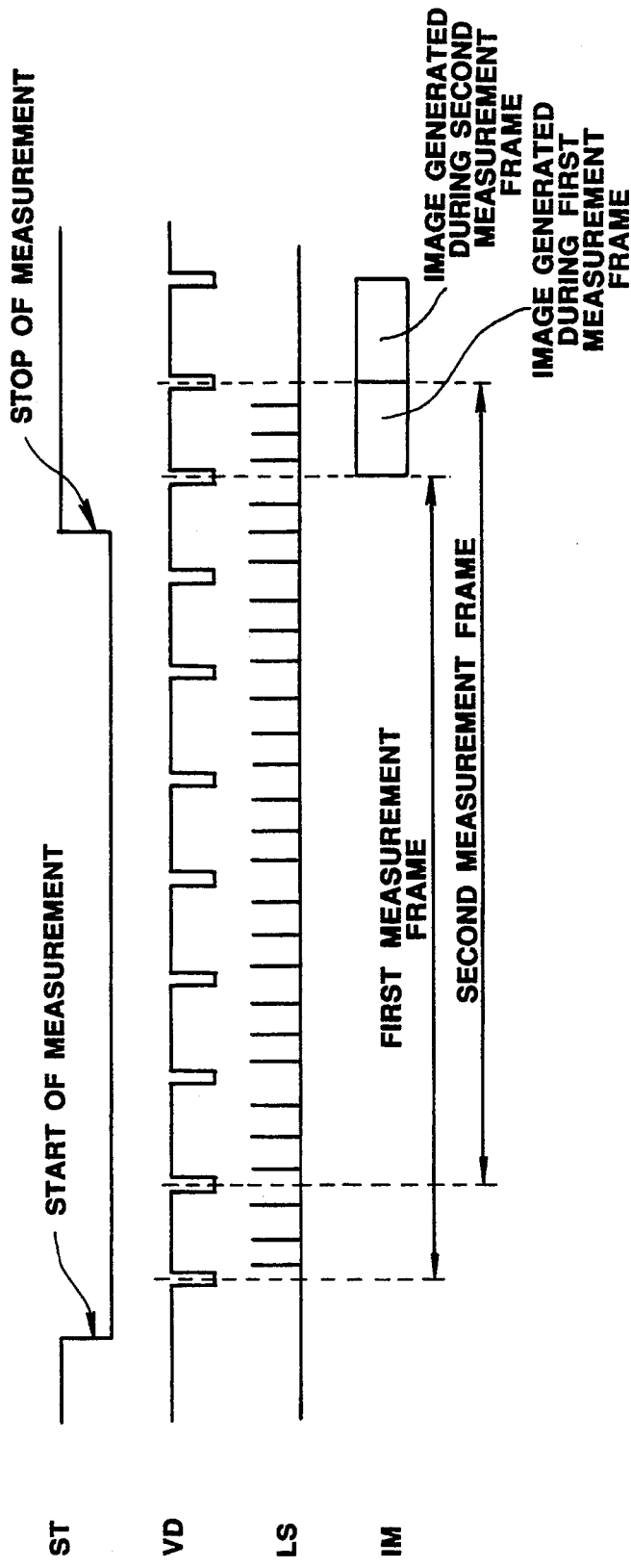
FIG. 10 is another example of a time chart.

FIG. 8 is a diagram showing an image which includes an addition reference mark in the present embodiment. In the case of a typical camera conforming to the NTSC system, jitter in the horizontal direction causes a problem in addition to jitter in the vertical direction. Hence, marks are provided in the vertical direction. It is desirable that the addition reference mark comprises a plurality of marks, since highly precise measurement is required. A fine mark pitch close to the limit of the resolution of the CCD may be adopted, and positional measurement may be performed using a moiré pattern produced with the CCD.

Next, a description will be provided of a procedure when addition reference mark 15 is used.

Figure 11:
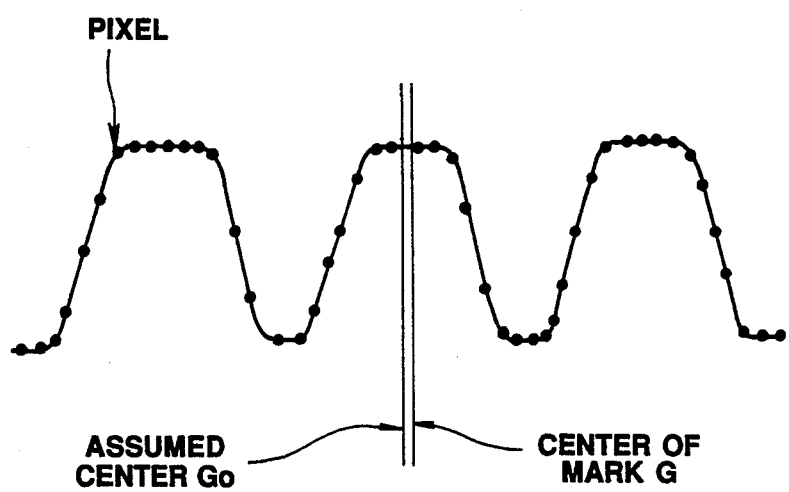
FIG. 11 is a diagram showing the waveform of a signal obtained by projecting and accumulating an addition reference mark.

FIG. 11 is a diagram showing the waveform over time of a signal obtained by projecting and accumulating addition reference mark 15 shown in FIG. 8 in the vertical direction of the picture frame. The center G of the mark is obtained, for example, by the calculation of the center of gravity from this waveform. This position can be obtained with an accuracy of about 1/10 of a pixel because of the effect of averaging a plurality of marks. The difference between the center G of the mark and a predetermined assumed center $G_0$ is made to be the amount of deviation.

Figure 12:
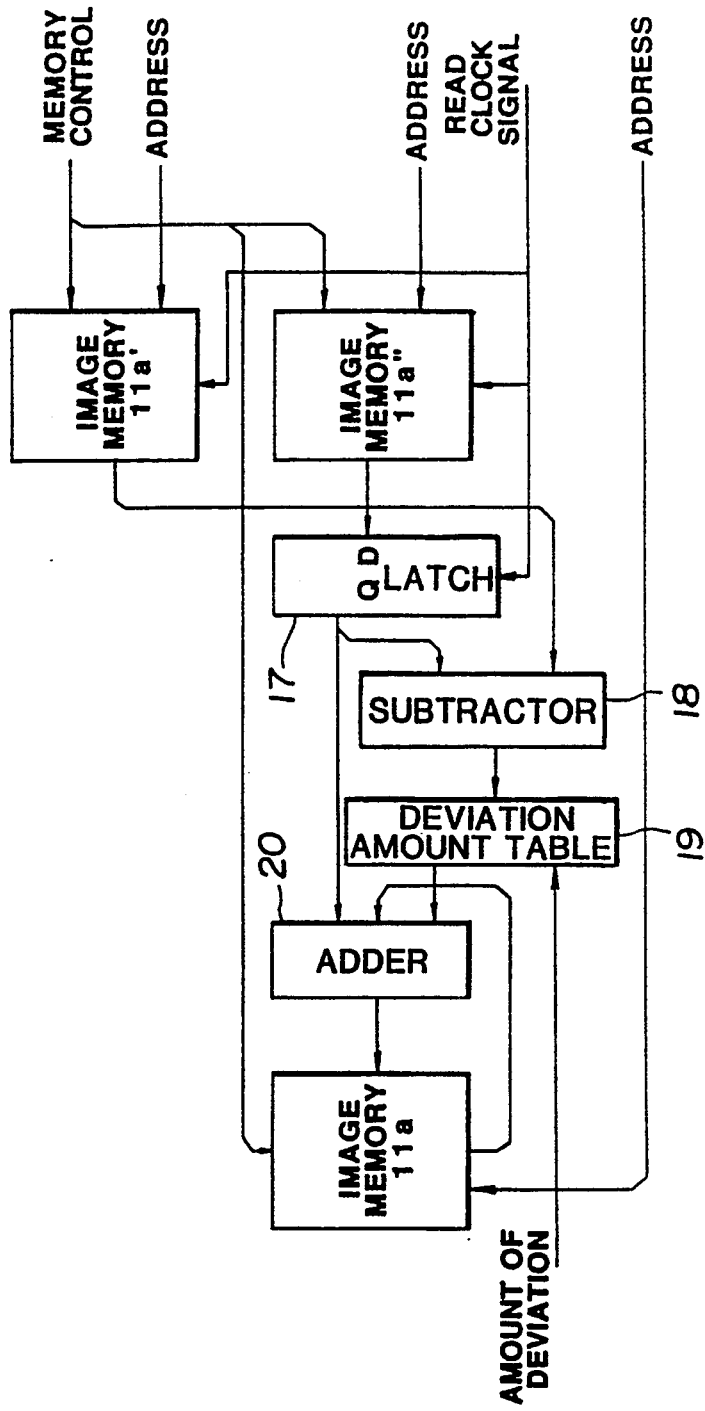
FIG. 12 is a block diagram illustrating an addition circuit.

FIG. 12 is a diagram showing an addition circuit. In FIG. 12, data from image memory 11a″ is output to the data side D of latch circuit 17 by a read clock signal, and is latched in latch circuit 17 by the next read clock signal. At that time, if the output Q of latch circuit 17 and the output of image memory 11a′ are input to subtracter 18, the output of subtracter 18 corresponds to the difference between the current output image (pixel) and the output image (pixel) of the preceding picture frame. If this difference and the above-described amount of deviation obtained using the current output image are input to deviation-amount table 19, comprising a high-speed RAM (random access memory) or the like, a pixel-interpolating output corresponding to the amount of deviation and the difference is obtained. This output signal and the outputs of image memory 11a and latch circuit 17 are added by adder 20, and the result of the addition is written in image memory 11a. Thus, the sum of the output of image memory 11a″ (the next image data stored in the above-described processing) corresponding to the above-described amount of deviation and data stored in image memory 11a is written in image memory 11a.

Figure 13:
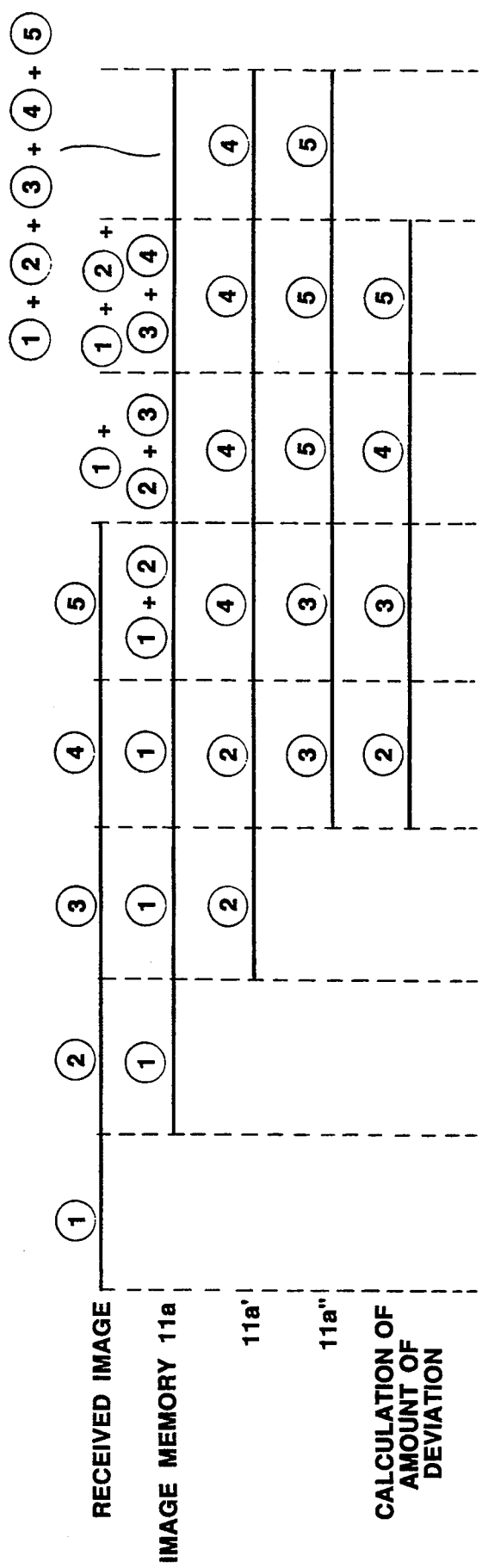
FIG. 13 is a time chart when images are superposed.

FIG. 13 is a time chart when five images are superposed. Image ② stored in image memory 11a′ is added to image ① stored in image memory 11a using the amount of deviation calculated during a time period for storing image ③ in image memory 11a″ and the result of the addition is stored in image memory 11a. This operation is repeated so that five images are added together. At the time when image signal ② is received by the alignment detection system 7, image signal ① is stored in image memory 11a. Image signal ① is also stored in memory 11a during the time period when signals ③ and ④ are received. During the time when image signal ③ is received by alignment detection system 7, image signal ② is stored in memory 11a′. Image signal ② continues to be stored in memory 11a′ when image signal ④ is received. In addition, when image signal ④ is received, image signal ③ is stored in memory 11a″, and the main control unit 12 calculates the amount of deviation of image signal ②. When image signal ⑤ is received, image memory 11a stores the sum of image signals ① and ② using the calculated amount of deviation of signal ②, image memory 11a′ stores image signal ④, image memory 11a″ stores image signal ③, and main control unit 12 calculates the amount of deviation of image signal ③. During the next time period, image memory 11a stores the sum of the image signals ①, ② and ③ using the calculated deviation in signal ③, image memory 11a′ continues to store image signal ④, image memory 11a″ stores image signal ⑤, and main control unit 12 calculates the amount of deviation of image signal ④. During the next time period, image memory 11a stores the sum of image signals ①, ②, ③ and ④, image memory 11a′ continues to store image image signal ④, image memory 11a″ continues to store image signal ⑤, and main control unit 12 calculates the amount of deviation of image signal ⑤. During the next time period, image memory 11a stores the sum of image signals ①, ②, ③, ④ and ⑤, image memory 11a′ continues to store image signal ④ and image memory 11a″ continues to store image signal ⑤. In the present embodiment, images are added using three memories. However, if memories corresponding to the number of additions are provided, addition may be performed after storing images in the respective memories. Although in the above-described embodiment the addition is performed assuming the same amount of deviation within one picture frame, the amounts of deviation may be calculated in a certain number of areas within one. Picture frame, and addition may be performed while changing the amount of deviation for each area.

While the present invention has been described what are presently considered to be the preferred embodiments, it is to be understood that the invention is not limited to the disclosed embodiments. The present invention is intended to cover various modifications and equivalent arrangements included within the spirit and scope of the appended claims.

The individual components represented by the blocks shown in FIGS. 1, 5, 7 and 12 are well known in the substrate aligning art and their specific construction and operation is not critical to the invention or the best mode for carrying out the invention. Moreover, the steps shown in FIGS. 3 and 4 for carrying out the present invention can be easily programmed into well-known central processing units by persons of ordinary skill of the art and since such programming per se is not part of the invention, no further description thereof is deemed necessary.

What is claimed is:

1. An aligning method, comprising the steps of:
   detecting misalignment of a substrate using an image signal from image pickup means for receiving light reflected by an alignment mark on the substrate illuminated by pulse light;
   moving the substrate in accordance the detected misalignment; and
   if the amount of light received by the image pickup means during a predetermined time period does not reach a predetermined value, increasing the predetermined time period, and reducing the amount of light emitted by the source of the pulse light for each pulse if the amount of light exceeds the predetermined value.

2. An aligning apparatus, comprising:
   illuminating means comprising a light source for generating pulse light for illuminating an alignment mark on a substrate;
   image pickup means for receiving light reflected by the alignment mark to generate an image signal;
   a signal processing circuit for detecting misalignment of the substrate based on the image signal;
   driving means for moving the substrate in accordance with an output from said signal processing circuit;
   a light-amount detector for monitoring the amount of light received by said image pickup means; and
   a light-modulating mechanism for adjusting the amount of light emitted by said light source in accordance with an output from said light-amount detector.

3. An aligning method, comprising the steps of:
   detecting misalignment of a substrate illuminated by pulse light using an image signal from image pickup means for receiving light reflected by an alignment mark on the substrate;
   moving the substrate in accordance with the detected misalignment; and
   enabling the detection of the misalignment in said detecting step by intermittently generating image signals by opening an electronic shutter in synchronization with the emission of the pulse light by the image pickup means, and storing and adding a predetermined number of the image signals generated by the image pickup means in memory means.

4. An aligning method according to claim 3, further comprising the steps of adding an image signal representing an addition reference mark which does not move relative to the image pickup means to each of the image signals, and correcting an error produced during said adding step of adding a predetermined number of image signals by the image signal representing the addition reference mark.

5. A positional error detection method, comprising the steps of:
   detecting positional error of a substrate using an image signal from image pickup means for receiving light reflected by an alignment mark on the substrate illuminated by pulse light; and
   if the amount of light received by the image pickup means during a predetermined time period does not reach a predetermined value, increasing the predetermined time period, and reducing the amount of light emitted by the light source of the pulse light for each pulse if the amount of light exceeds the predetermined value.

6. A positional error detection apparatus, comprising:
   illuminating means comprising a light source for generating pulse light for illuminating an alignment mark on a substrate;
   image pickup means for receiving light reflected by the alignment mark to generate an image signal;
   a signal processing circuit for detecting positional error of the substrate based on the image signal;
   a light-amount detector for monitoring the amount of light received by said image pickup means; and
   a light-modulating mechanism for adjusting the amount of light emitted by said light source in accordance with an output from said light-amount detector.

7. A positional error detection method, comprising the steps of:
   detecting positional error of a substrate illuminated by pulse light using an image signal from image pickup means for receiving light reflected by an alignment mark provided on the substrate; and
   enabling the detection of the positional error in said detecting step by intermittently generating image signals by opening an electronic shutter in synchronization with the emission of the pulse light by the image pickup means, and storing and adding a predetermined number of the image signals generated by the image pickup means in memory means.

8. A positional error detection method according to claim 7, further comprising the steps of adding an image signal representing an addition reference mark which does not move relative to the image pickup means to each of the image signals, and correcting an error produced during said adding step of adding a predetermined number of image signals by the image signal representing the addition reference mark.

9. A position detecting method comprising the steps of:
   illuminating a mark on a substrate by pulse light from a pulse light source;
   receiving light, which is reflected by the mark, with image pickup means;
   determining the position of the substrate by using an image signal from the image pickup means; and
   if the amount of light received by the image pickup means during a predetermined time period does to reach a predetermined value, increasing the predetermined time period, and reducing the amount of light emitted by the pulse light source for each pulse if the amount of light exceeds the predetermined value.

10. A position detecting apparatus, comprising:

illuminating means comprising a light source for generating pulse light for illuminating a mark on a substrate;

image pickup means for receiving light reflected by the mark to generate an image signal;

a signal processing circuit for determining the position of the substrate based on the image signal;

a light-amount detector for monitoring the amount of light received by said image pickup means; and a light-modulating mechanism for adjusting the amount of light emitted by said light source in accordance with an output from said light-amount detector.

11. A position detecting method comprising the steps of:

illuminating a mark on a substrate by pulse light;

receiving light, which is reflected by the mark, with image pickup means;

determining the position of the substrate by using an image signal from the image pickup means; and enabling the determination of the position in said determining step by intermittently generating image signals by opening an electronic shutter permitting light to be received by the image pickup means in synchronization with the emission of the pulse light and storing and adding a predetermined number of the image signals generated by the image pickup means in memory means.

12. A position detecting method according to claim 11, further comprising the steps of adding an image signal representing an additional reference mark which does not move relative to the image pickup means to each of the image signals, and correcting an error produced during said adding step of adding a predetermined number of image signals by the image signal representing the additional reference mark.

* * * * *

UNITED STATES PATENT AND TRADEMARK OFFICE
CERTIFICATE OF CORRECTION

PATENT NO. : 5,347,118
DATED : September 13, 1994
INVENTOR(S) : TAKEHIKO IWANAGA It is certified that error appears in the above-indentified patent and that said Letters Patent is hereby corrected as shown below:

In the drawing, sheet 7:

Figure 7

"LASCR" should read --LASER--.

COLUMN 6

Line 21, "supplies" should read --supply--.
Line 41, "it" should be deleted.
Line 58, "Also" should read --Also,--.

COLUMN 8

Line 15, "thereafter.  The" should read --thereafter the--.

COLUMN 9

Line 26, "is-omitted" should read --is omitted--.

COLUMN 10

Line 5, "11a" should read --11a,--.
Line 25, " (22)   .In" should read -- (22).  In--.

UNITED STATES PATENT AND TRADEMARK OFFICE
CERTIFICATE OF CORRECTION

PATENT NO. : 5,347,118

DATED : September 13, 1994

INVENTOR(S) : TAKEHIKO IWANAGA

It is certified that error appears in the above-indentified patent and that said Letters Patent is hereby corrected as shown below:

COLUMN 13

Line 2, "one. Picture" should read --one picture--.

COLUMN 14

Line 66, "does to" should read --does not--.

Signed and Sealed this

Seventh Day of February, 1995

Attest:

BRUCE LEHMAN

Attesting Officer

Commissioner of Patents and Trademarks